US006377495B1

United States Patent
Lorenz

(10) Patent No.: US 6,377,495 B1
(45) Date of Patent: Apr. 23, 2002

(54) APPARATUS AND METHOD FOR PROVIDING A BIAS TO READ MEMORY ELEMENTS

(75) Inventor: Perry Scott Lorenz, Fort Collins, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/718,821

(22) Filed: Nov. 22, 2000

(51) Int. Cl.$^7$ ................................................ G11C 7/00
(52) U.S. Cl. ........................ 365/189.09; 365/185.21; 365/226
(58) Field of Search .......................... 365/226, 189.09, 365/230.01, 185.21

(56) References Cited

U.S. PATENT DOCUMENTS 5,659,519 A * 8/1997 Lee et al. ............... 365/189.09

\* cited by examiner

Primary Examiner—Terrell W. Fears

(74) Attorney, Agent, or Firm—Merchant & Gould PC

(57) ABSTRACT

A method and apparatus for dynamically determining when a bias circuit has reached a steady-state operation so that the memory elements (e.g., EPROMs) may be read. The bias circuit includes a read enable circuit, a bias circuit, and an output circuit. The bias circuit is configured to dynamically detect a memory element bias voltage in response to a read enable signal, which is provided by the read enable circuit. The memory element bias voltage varies from an initial voltage to a final voltage based on the amount of loading due to the memory elements (e.g., EPROMs). The bias circuit outputs a read signal when the memory element bias voltage reaches the final voltage. The memory elements initiate reading data that is stored in the memory elements in response to the read signal. The bias circuit may include a bias generator, a memory element driver and a detector. The bias generator is configured to generate an internal bias voltage. The memory element driver is responsive to the internal bias voltage and is configured to produce a sense current that varies with the memory element bias voltage. The detector is configured to produce a reference current. The reference current may be substantially similar to a memory element current that flows through one of the memory elements during the reading of the memory element. The detector also generates the read signal based on a comparison of the reference current with the sense current.

20 Claims, 8 Drawing Sheets

APPARATUS AND METHOD FOR PROVIDING A BIAS TO READ MEMORY ELEMENTS

TECHNICAL FIELD

The present invention relates to bias circuits, and more particularly to an interactive bias circuit for reading non-volatile memory elements.

BACKGROUND OF THE INVENTION

Many electronic systems include memory devices. The memory devices are often used to store critical information that is needed by the electronic system. In some instances it is necessary for the memory device to provide non-volatile storage. Non-volatile memories allow for information to be permanently or semi-permanently stored such that removing power from the memory does not destroy the stored information. Example non-volatile memory devices include Erasable Programmable Read Only Memory (EPROM) as well as others.

The trend in the electronics industry is to reduce overall power consumption in electronic systems. This trend is largely due to the proliferation of battery powered electronic systems. In an effort to preserve battery life, battery powered devices require their electronics to consume less power under operation. Because electronics are often disabled to conserve power, non-volatile memory devices are well suited to preserve any critical information required by the electronics.

Non-volatile memories often require a significant amount of power during operation. This is partially due to a bias circuit that is employed to bias the non-volatile memory during operation. In order to reduce power consumption, the bias circuit is disabled until operation is required. When the electronic system is ready to read or write to the non-volatile memory, the associated bias circuit is enabled.

In order to correctly read the memory device, a correct bias voltage must be available for use by the memory device. When the associated bias circuit is first enabled, the bias voltage may not be available until the biasing circuit reaches a steady-state operating condition. After the associated biasing circuit reaches the steady-state operating condition the memory device can be correctly accessed. Therefore, the memory device should not be read until the correct biasing voltage is available.

Many bias circuits implement an open-loop delay using one-shot circuits or capacitor timing type delay circuits that are designed to handle a worst-case delay. By designing the open-loop delay to handle a worst-case delay, the bias circuit ensures that the correct bias voltage is reached before reading the memory element. Typically, these bias circuits are tailored to the processing environment and need to be re-designed when the number of memory elements changes or when the processing environment changes.

SUMMARY OF THE INVENTION

The present invention provides an interactive bias circuit that dynamically determines when the bias circuit has reached a steady-state operation without adding "artificial" margins to compensate for temperature variations, process variations and power supply ranges. In addition, because the interactive bias circuit determines the actual condition of the bias circuit, the interactive bias circuit may be reused without redesigning the bias circuit when additional memory elements are added.

In one embodiment, the interactive bias circuit includes a read enable circuit, a bias circuit, and an output circuit. The read enable circuit is configured to provide a read enable signal, such as when power-on is detected. The bias circuit provides a read signal in response to the read enable signal and a memory element bias voltage. The read signal is in a first state when the memory element bias voltage is a non-final voltage and the read signal is in a second state when the memory element bias voltage is a final voltage. The bias circuit is configured to dynamically detect when the memory element bias voltage is at the final voltage. The memory element bias voltage transitions from the non-final voltage to the final voltage based on the loading of the memory elements (e.g., EPROMs) on the bias circuit. When the memory element bias voltage obtains the final voltage, the bias circuit outputs a read signal that initiates reading of data stored in the memory elements. The output circuit is configured to detect when the memory elements have been read using the read enable signal and the output data generated from the memory elements. The output circuit may further be configured to signal the read enable circuit to remove the read enable signal, thus ending a read cycle of the memory elements.

In one aspect of the invention, the output data includes a first output and a second output for each of the memory elements. The first output and second output correspond to a charge that is stored in the memory element. The output circuit detects when the memory elements have been read based on the first and second output of one of the memory elements.

In another aspect of the invention, the bias circuit includes a bias generator, a memory element driver and a detector. The bias generator is configured to generate an internal bias voltage that is provided to the memory element driver and the detector. The memory element driver produces the memory element bias voltage in response to the internal bias voltage and is configured to produce a sense current that is responsive the memory element bias voltage such that the sense current varies with the memory element bias voltage. The detector is configured to produce a reference current. The reference current may be substantially similar to a memory element current that flows through one of the memory elements during the reading of the memory element. The detector also generates the read signal based on a comparison of the reference current with the sense current. The sense current may be increased by a pre-determined factor before the comparison of the reference current with the sense current in order to ensure accuracy for the read signal.

In still another aspect of the invention, the bias circuit may further include a feedback suppression logic. The feedback suppression logic is configured to suppress feedback from the memory elements that affect the read signal.

In another embodiment of the invention, a method of reading memory elements of an electronic device is provided. The method includes enabling a bias circuit that activates a read operation of the memory elements within the electronic device. Once the bias circuit is activated, a reference current is generated. The reference current corresponds to a memory element current within one of the memory elements that occurs during the read operation. In addition, a sense current is produced. The sense current varies in accordance with the loading of the memory elements on the bias circuit. The reference current and the sense current are compared and when the difference is within a pre-determined threshold, a memory read of the memory elements is initiated. Once the memory read of the memory elements has completed, the bias circuit is disabled.

In one aspect of the invention, the sense current is increased by a predetermined factor before comparing the reference current with the sense current.

In another aspect of the invention, producing a sense current includes detecting the loading of the memory elements on the bias circuit. The loading of the memory elements produces a bias voltage. The sense current varies in relation to the changing bias voltage. The difference between the reference current and the sense current will be within the pre-determined threshold once the bias voltage obtains a final bias voltage. The final bias voltage provides adequate voltage to each of the memory elements to ensure a successful memory read.

In yet another embodiment of the invention, an interactive bias circuit for reading a plurality of non-volatile memory elements is provided. The interactive bias circuit includes a power-on sensing means, a generator means, a memory element replica means, a detector means and an output means. The power-on sensing means provides a read enable signal upon sensing that power is available to the interactive bias circuit. Upon detecting the read enable signal, the generator means generates a bias voltage that is used by the memory element replica means and the detector means. The memory element replica means produces a sense current upon detecting the read enable signal. The sense current varies in accordance with a loading associated with the non-volatile memory elements. The memory element replica means also provides a memory element bias voltage to the non-volatile memory elements that allows reading to occur. The detector means produces a reference current upon detecting the read enable signal. The reference current is substantially similar to a memory element current resident in the memory elements during a read operation. The detector means may further detect when the sense current and the reference current are within a pre-determined threshold. Once the sense current and reference current are within the predetermined threshold, the detector means provides a ready signal to the non-volatile memory elements. The ready signal initiates the read operation within the non-volatile memory elements. The output means detects when the read operation has completed and signals the power-on sensing means to remove the read enable signal, thus, completing a read cycle.

In one aspect of the invention, the interactive bias circuit may further include a feedback suppression means. The feedback suppression means suppresses feedback from the memory elements that affect the ready signal.

In another aspect of the invention, the generator means includes a current source that produces the bias voltage used by the memory element replica means and the detector means.

In still another aspect of the invention, the memory element replica means includes a first and second diode connected transistor in series. The first diode connected transistor couples to a power supply voltage and the second diode connected transistor couples to a first node. The memory element bias voltage is provided at the first node.

In yet another aspect of the invention, the memory element replica means further includes a switching transistor. The switching transistor is coupled to the power supply voltage and the first node. The memory element bias voltage is maintained at the power supply voltage by the switching transistor until the read enable signal becomes active.

In still yet another aspect of the invention, the detector means includes two diode-connected transistors in series, a first current mirror, and a second current mirror. The reference current is reflected by the first mirror into the second mirror. The second mirror reflects the reference current into a second node. When the sense current overcomes the reference current at the second node, the ready signal becomes active.

In still a further aspect of the invention, the detector means further includes a switching transistor. The switching transistor is coupled to the second mirror at the second node and is configured to receive the read enable signal. The switching transistor maintains the ready signal at a first state until the read enable signal becomes active.

DETAILED DESCRIPTION OF THE PREFERRED EMBODIMENT

Figure 1:
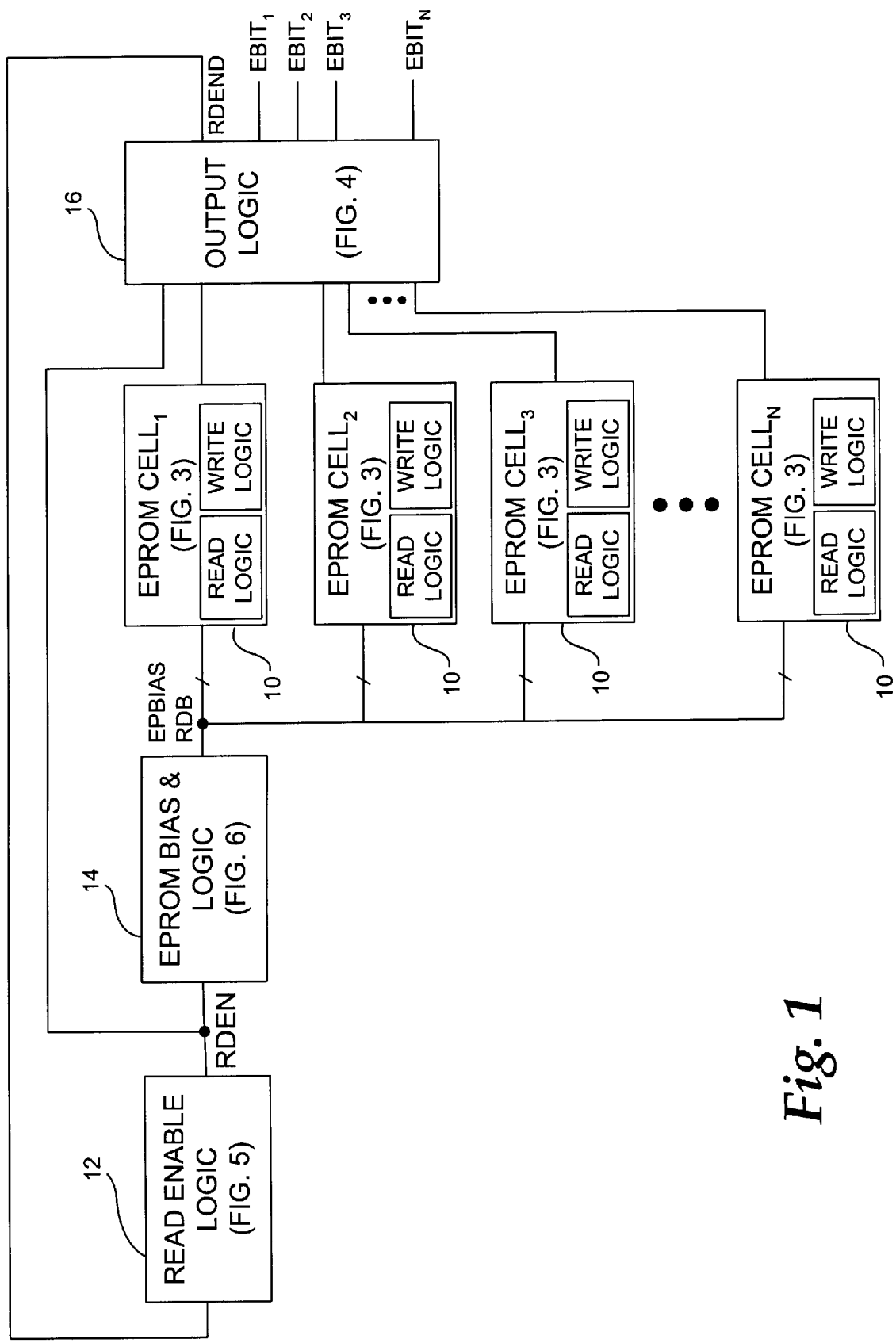
FIG. 1 is a block diagram illustrating a functional overview of an electronic system for reading a memory element.

FIG. 1 is a block diagram illustrating a functional overview of an electronic system useful for reading a plurality of memory elements (10). Memory elements (10) may include any type of memory element, such as EPROM, flash EPROM and electrically erasable programmable read only memory (EEPROM). The memory elements (10) depicted in FIG. 1 are EPROM memory cells (hereinafter, referred to as the EPROM cells$_{1-N}$). A read enable logic component (12) includes a power-on sense circuit (not shown). The power-on sense circuit senses when power is turned on and outputs a read enable signal (RDEN). The read enable signal (RDEN) is input into an EPROM bias and logic component (14). EPROM bias and logic component 14 interactively detects when an EPROM bias voltage (EPBIAS) has been established and outputs an inverted logic read signal (RDB). Inverted logic read signal (RDB) is input into EPROM cells$_{1-N}$ (10). Read signal RDB initiates reading of data stored in the EPROM cells (10) when active. An output logic component (16) receives the read enable signal (RDEN) from the read enable logic component (12). The output logic component (16) also receives inputs from the EPROM cells$_{1-N}$ (10). The output logic component (12) latches the data read from the EPROM cells (10) and then outputs latched data EBIT$_{1-N}$. The latched data (EBIT$_{1-N}$) corresponds to the data read from EPROM cells$_{1-N}$ (10), respectively.

Based on the disposition of the read enable signal (RDEN) and the inputs from the EPROM cells$_{1-N}$ (10), the output logic component (16) detects when the data in the EPROM cells (10) has been read. After detecting that the EPROM cells (10) have been read, the output logic component (16) generates a read end signal (RDEND). The read end signal (RDEND) is input into the read enable logic component (12) to clear the read enable signal (RDEN). When the read enable signal (RDEN) changes states, the read cycle for reading the EPROM cells (10) is complete.

Figure 2:
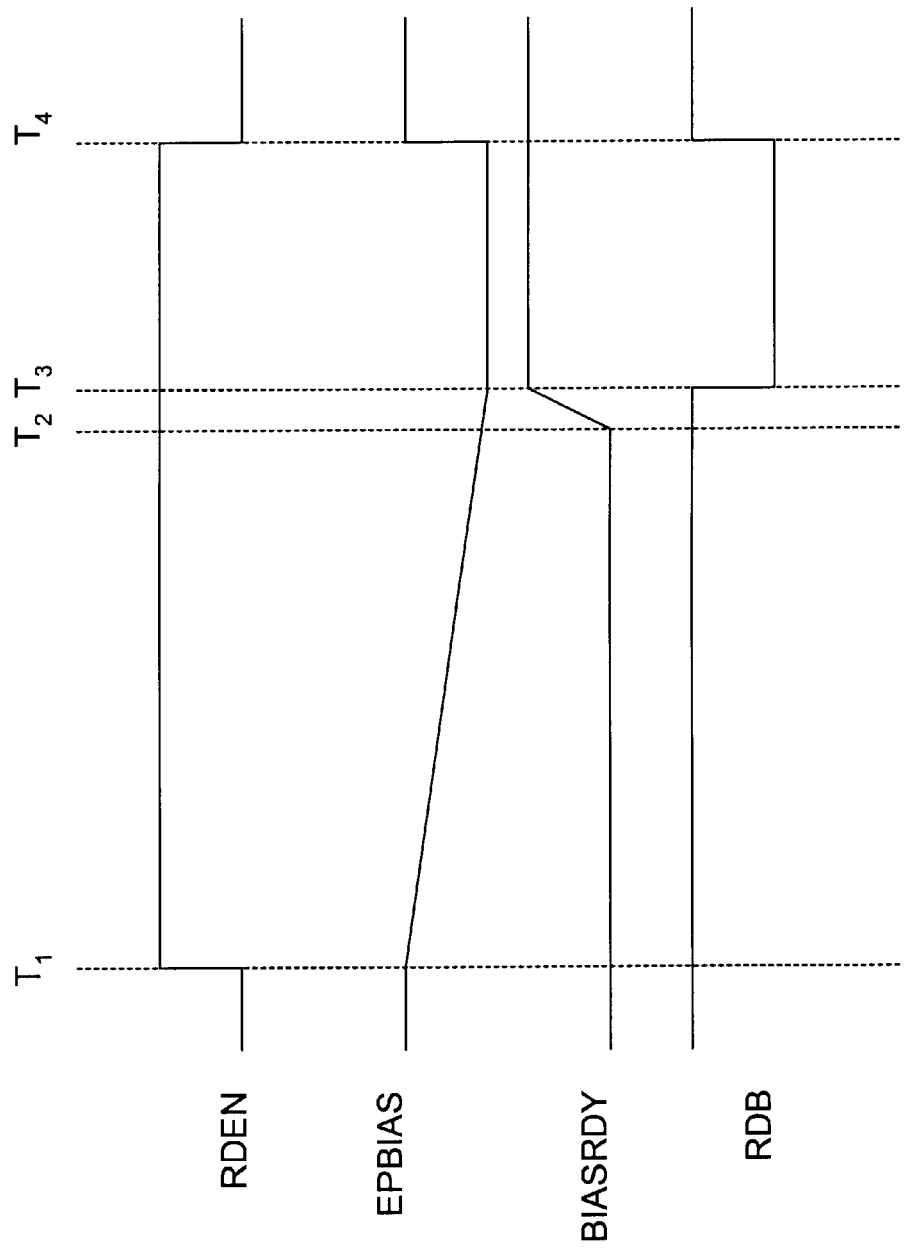
FIG. 2 is a timing diagram illustrating ideal voltage waveforms generated by the electronic system depicted in FIG. 1.

FIG. 2 is a timing diagram illustrating ideal voltage waveforms generated by the electronic system depicted in FIG. 1. The read enable signal (RDEN) is generated in the read enable logic component (12). The inverted logic read signal (RDB) is generated in the EPROM bias and logic component (14) after the EPROM bias and logic component (14) has sensed that the EPROM bias voltage (EPBIAS) has reached a proper steady-state bias voltage. An internal bias ready signal (BIASRDY) is generated within the EPROM bias and logic component (14).

In general, as shown in FIG. 2, the present invention initiates the read logic signal (RDB) after the EPROM bias voltage (EPBIAS) has reached a final steady-state bias voltage. The final steady-state bias voltage is necessary for proper operation of the EPROM cells during their read cycle. In bias circuits that use one-shot circuits and/or timed delay circuits, the read signal (RDB) is initiated at some time interval after the EPROM bias voltage (EPBIAS) has reached a final bias voltage. The bias circuits that include one-shot and/or timed delay circuit are designed such that the delay is great enough to handle a worst-case operating condition for a specific EPROM configuration.

In contrast, the bias circuit of the present invention is interactive and dynamically measures the actual condition of the bias circuit for the EPROM. The present invention determines the condition of the bias circuit regardless of the amount of time required to achieve steady-state operation. Although the actual delay time for the bias circuit reaching steady-state operation may vary, the present invention will account for these variations without adding additional "artificial" margins to compensate for temperature variations, process variations and power supply ranges. In addition, because the interactive bias circuit determines the actual condition of the bias circuit, the bias circuit may be reused without redesigning the bias circuit when additional EPROM cells (10) are added.

Referring to the timing diagram in FIG. 2, prior to time $T_1$, the read enable logic signal (RDEN) is low indicating that a read cycle has not been initiated. Also, the EPROM bias voltage (EPBIAS) is held high to conserve power, and the bias ready signal (BIASRDY) and the inverted logic read signal (RDB) are inactive.

At time $T_1$, the read enable signal (RDEN) goes high initiating a read cycle. The EPROM bias voltage (EPBIAS) transitions from an initial voltage at time $T_1$ to a final voltage at time $T_3$. However, before time $T_3$, at time $T_2$, the EPROM bias and logic component (14) begins detecting that the EPROM bias voltage (EPBIAS) is reaching the final bias level, which causes the bias ready signal (BIASRDY) to transition towards an active high state. The bias ready signal (BIASRDY) and the EPROM bias voltage (EPBIAS) both reach their final states substantially at time $T_3$.

Once bias ready signal BIASRDY is high, the inverted logic read signal (RDB) becomes active (low) and reading of the EPROM cells commences. At a later, time ($T_4$), the read enable signal (RDEN) is deactivated, returning to low, indicating that the output logic (16) has detected that the EPROM cells (10) have been read. The falling edge of the read enable signal (RDEN) causes the inverted read signal (RDB) to go high, and the EPROM bias voltage (EPBIAS) returns to its initial value to complete the read cycle.

Figure 3:
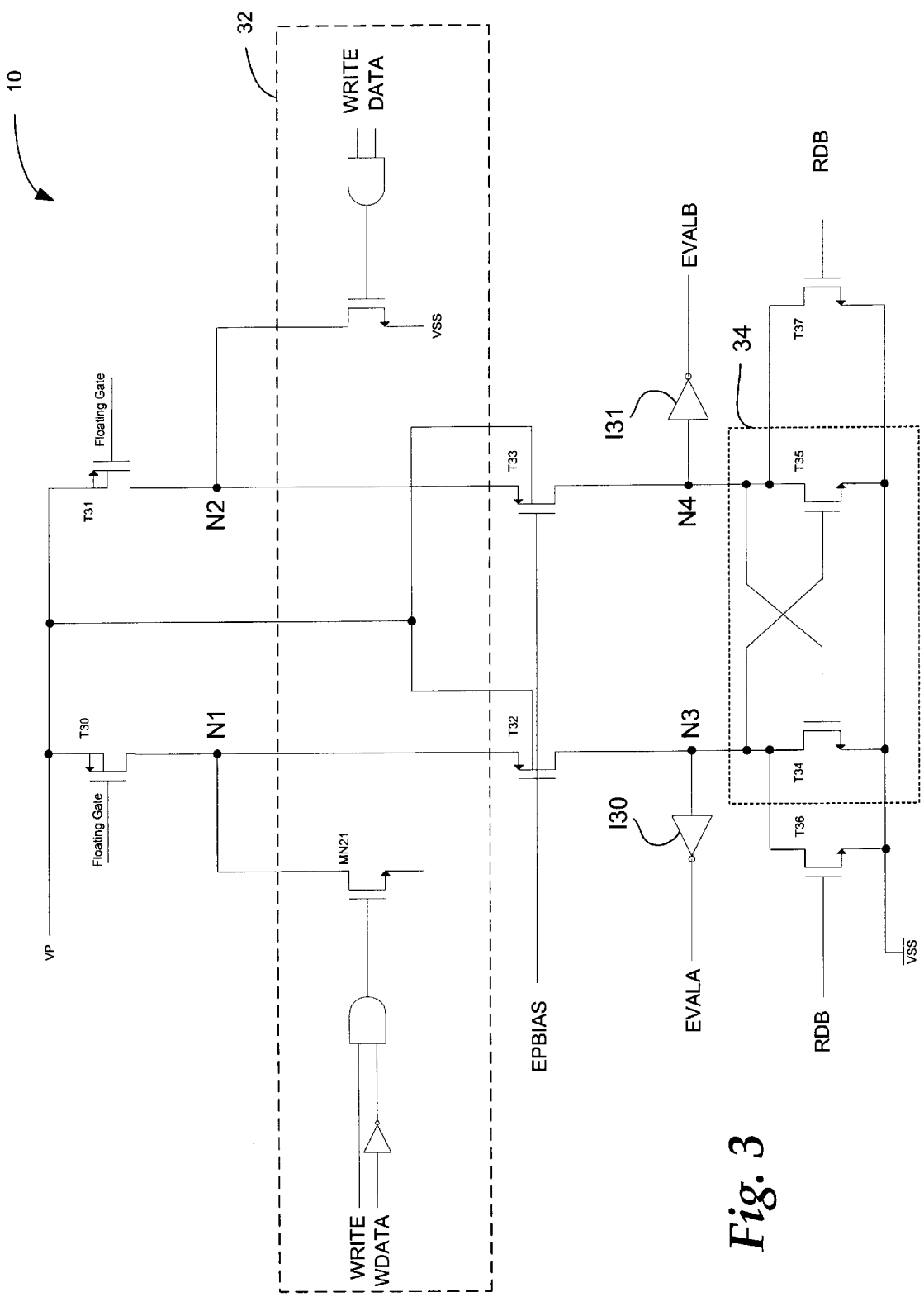
FIG. 3 is a schematic diagram illustrating one embodiment of the memory element depicted in FIG. 1.

FIG. 3 is a schematic diagram illustrating one embodiment of a memory device (i.e. EPROM) that may be used in the electronic system depicted in FIG. 1. As mentioned earlier, the memory devices depicted in FIGS. 1 and 3 are EPROM memory cells (10, EPROM cells$_{1-N}$). Transistors T30 and T31 have common sources connected to a power supply voltage (VP). The drain of transistors T30 and T31 are connected to nodes N1 and N2, respectively. Transistor T32 has a source connected to node N1, a gate connected to EPBIAS and a drain connected to node N3. Transistor T33 has a source connected to node N2, a gate connected to EPBIAS, and a drain connected to node N4. A cross-coupled latch circuit (34, depicted in an outlined box) is connected to nodes N3 and N4 as will be discussed later.

Write logic (32, represented graphically within an outlined box) is connected to nodes N1 and N2 as shown in FIG. 3. Prior to the read cycle performed in accordance with the present invention, write logic (32) stores a charge on either transistor T30 or transistor T31. The gates of transistors T30 and T31 are floating. During a write cycle (not shown), charge is driven into the gate oxide of a selected one of the transistors (T30, T31) by applying a voltage to the drain of the selected device. Since the charge is injected into the gate oxide, the transistors (T30, T31) act as memory devices storing charge. Alternatively, a charge is deposited on the gate of the selected transistor, where the gate acts as a capacitive memory.

The drain of transistor T30 is connected at node N1 to the output of side A write logic. The drain of transistor T31 is connected at node N2 to the output of side B write logic. Side A and side B write logic are included in the write logic (32) used to store a charge. The write logic 32 is not pertinent to the discussion of the read cycle of the present invention and is, thus, not discussed in further detail.

The drain of transistor T32 is connected at node N3 to an input of an inverter (I30). The output of the inverter (I30) provides a side A data value (EVALA). Similarly, the drain of transistor T33 is connected at node N4 to an input of an inverter (I31). The output of the inverter (I31) provides a side B data value (EVALB). Briefly, when the EPROM cell (10) is read, either side A data value (EVALA) or side B data value (EVALB) will be high depending on whether transistor T30 or transistor T31 has a charge stored thereon. The cross-couple latch (34) ensures that either the side A data value (EVALA) or the side B data value (EVALB) is high while the other side is held low.

Cross-couple latch 34 includes two transistors (T34, T35). The drain of transistor T34 is connected at node N3 to the drain of transistor T36. The drain of transistor T35 is connected at node N4 to the drain of transistor T37. The sources of transistors T34, T35, T36 and T37 are connected in common to voltage VSS. The gate of transistor T34 is cross-coupled to the drain of transistor T35. Similarly, the gate of transistor T35 is cross-coupled to the drain of transistor T34. The gates of transistors T36 and T37 are commonly connected to the inverted read signal (RDB).

Prior to initiating a read cycle, EPROM bias (EPBIAS) is held high, which deactivates transistors T32 and T33. When inverted read signal (RDB) and EPROM bias are high, transistors T36 and T37 are activated and the drains of transistors T36 and T37 are coupled to ground (VSS). Since nodes N3 and N4 are low, the side A data value (EVALA) and the side B data value (EVALB) are high. As the EPROM bias (EPBIAS) transitions from the initially high voltage to a final voltage (between times $T_1$ to $T_3$, as illustrated in FIG. 2), a voltage appears across transistors T30 and T31 and two differential currents flow in transistors T32 and T33 (once RDB is active as discussed later). Whichever transistor, T30 or T31, has charge stored on its gate or gate oxide will carry more current than the other. The two differential currents, however, cannot change nodes N3 and N4 until the inverted read signal (RDB) becomes active (low, at time $T_3$ in FIG. 2).

Once inverted read signal RDB becomes active, current will begin to flow through transistors T32 and T33. The current flow in transistor T32 will be different from the current flow in transistor T33 due to the charge stored on transistors T30 and T31. The inequality in the current flow will cause a race condition between the potential at nodes N3 and N4 as to which node will go high. The node corresponding to the higher current conduction will go high, while the other node will then be held low. After the nodes N3 and N4 have latched into their final states, either the side A data value (EVALA) or the side B data value (EVALB) will change states, going low. When the side A data value (EVALA) and the side B data value (EVALB) are not in the same state, the EPROM cell has been successfully read.

An illustrative example of dimensions for the transistors T30–T37 follows. Transistors T30 and T31 are PMOS transistors, having widths equal to 900 nm and lengths equal to 500 nm. Transistors T32 and T33 are PMOS transistors, having widths equal to 5 um and lengths equal to 600 nm. Transistors T34 and T35 are NMOS transistors, having widths equal to 2 um, and lengths equal to 5 um. Transistors T36 and T37 are NMOS transistors, having widths equal to 3 um and lengths equal to 1 um. As will be described in detail with reference to FIG. 7, the EPROM bias and logic (14) attempts to replicate transistors T30–T33 by connecting representative devices in the EPROM bias and logic component (14) similarly, and using substantially similar dimensions.

Figure 4:
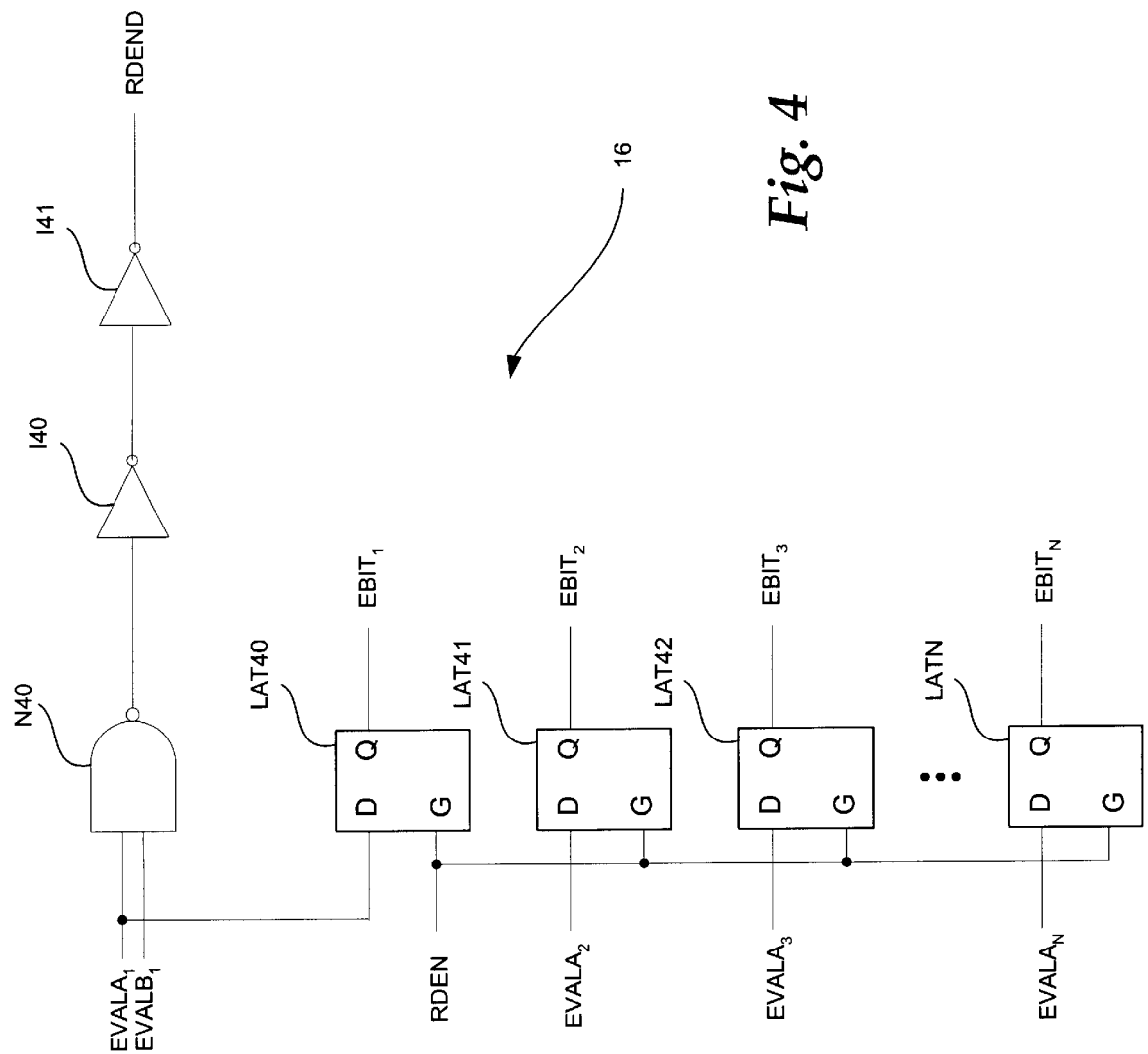
FIG. 4 is a schematic diagram illustrating one embodiment of the output logic component depicted in FIG. 1.

FIG. 4 is a schematic diagram illustrating one embodiment of the output logic component (16) depicted in FIG. 1. The output logic component (16) includes a NAND gate N40, inverters I40 and I41, and D-type latches LAT40–LATN. NAND gate N40 has an output connected to the input of inverter I40. The output of inverter I40 drives the input of inverter I41. The output of inverter I41 is a read end signal (RDEND). Inputs to NAND gate N40 are the side A data value (EVALA) and the side B data value (EVALB) from one of the EPROM cells (10, one embodiment illustrated in FIG. 3). Each latch LAT40–LATN receives a side A data value (EVALA) from a respective EPROM CELL$_{1-N}$. FIG. 4 illustrates the side A data value (EVALA) as inputs into latches LAT40–LATN. However, the output logic component may be modified to accommodate the side B data value (EVALB) as input into the latches. In addition, each latch LAT40–LATN accepts the read enable signal (RDEN). The outputs of the latches (EBIT$_{1-N}$) represent the data stored in the corresponding EPROM cells (EPROM CELL$_{1-N}$).

Although D-type latches are used as memory latches, any other suitable arrangement of logic and memory cells may be used to replace the D-type latches. Alternative memory cells include, but are not limited to, RS-flip-flops, JK flip-flops, master-slave flip-flops, charge storage devices, and any other suitable memory storage cell.

In operation, once the read enable signal (RDEN) is high (see time $T_1$ in FIG. 2), latches LAT40–LATN begin accepting the side A data values EVALA$_{1-N}$ at their respective D inputs. When the read enable signal (RDEN) goes low (see time $T_4$ in FIG. 2), latches LAT40–LATN latch the side A data values (EVALA$_{1-N}$) and output EBIT$_{1-N}$ at the respective Q outputs. Once NAND gate N40 detects either the side A data value (EVALA) or the side B data value (EVALB) goes low (i.e., EPROM cell has been read), the NAND gate outputs a signal corresponding to the read end signal (RDEND). The two inverters I40 and I41 slow the output of the NAND gate down. Because only information from one of the EPROM cells (i.e., EVALA$_1$ and EVALB$_1$) is used to detect when that EPROM cell is read, the two inverters I40 and I41 are used to add sufficient delay time to the read end signal (RDEND) to ensure that all of the EPROM cells have been read. The read end signal (RDEND) is used in the read enable logic (12) to reset the read enable signal (RDEN), as will be described further below.

Figure 5:
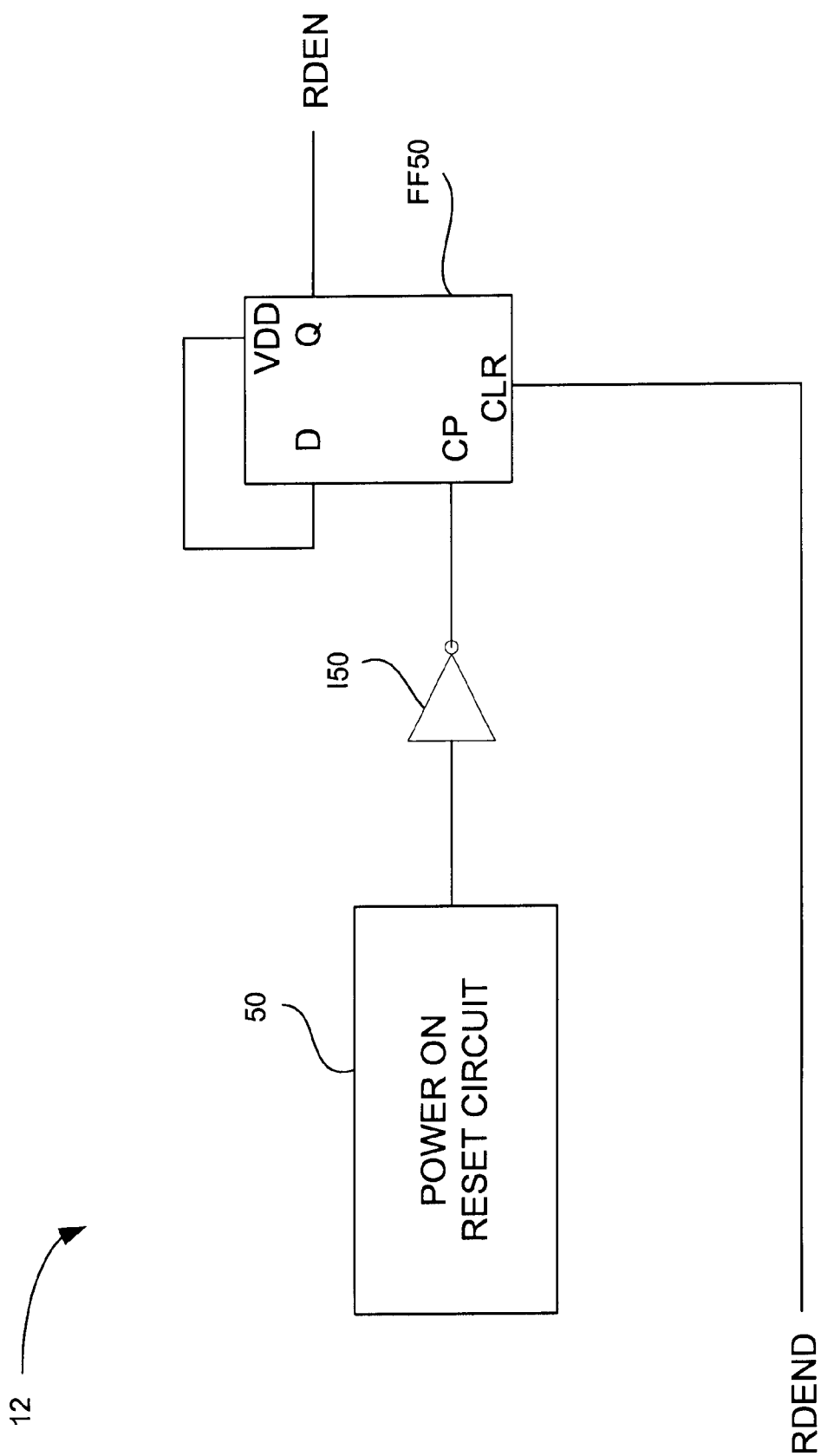
FIG. 5 is a schematic diagram illustrating one embodiment of the read enable logic component depicted in FIG. 1.

FIG. 5 is a schematic diagram illustrating one embodiment of the read enable logic component (12) depicted in FIG. 1. The read enable logic component (12) includes a power on reset circuit (50), an inverter I50, and a D-type flip-flop FF50. An input of the flip-flop FF50 is connected to a set terminal of the flip-flop (FF50) that is tied to power (VDD). The read end signal, generated in the output logic component (16), is connected to a clear terminal of flip-flop FF50. The output of flip-flop FF50 (Q) generates the read enable signal (RDEN).

In operation, once the power on reset circuit (50) detects power, the circuit 50 outputs a high to low transition that is input into inverter I50 and a high is clocked into flip-flop FF50. Flip-flop FF50 turns on the read enable signal (RDEN), as illustrated at time $T_1$ in the timing diagram shown in FIG. 2. Once the EPROM cell has been read and the output logic component (16) outputs the read end signal (RDEND), the read end signal (RDEND) clears flip-flop FF50. Clearing flip-flop FF50 causes the read enable signal (RDEN) to turn off, as illustrated at time $T_4$ in the timing diagram shown in FIG. 2.

Figure 6:
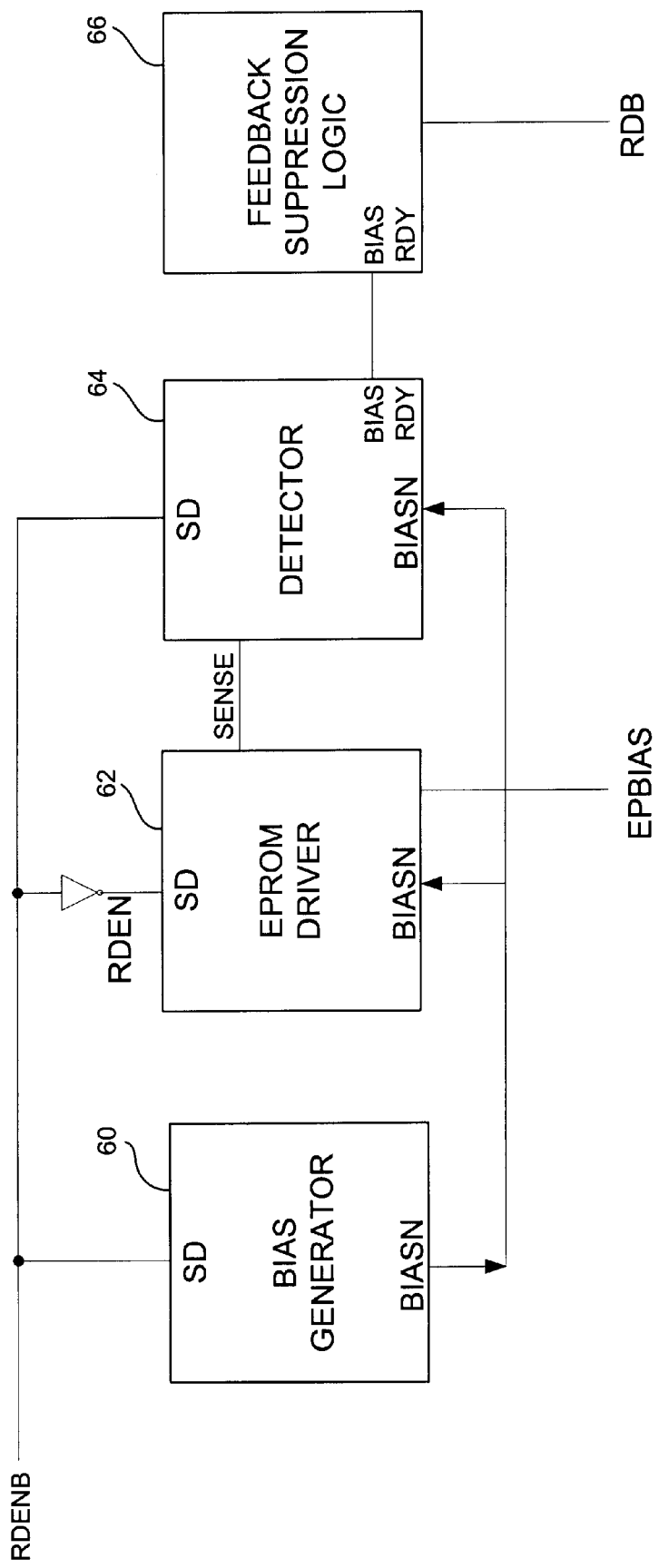
FIG. 6 is a block diagram illustrating a simplified functional block diagram of the EPROM bias and logic component depicted in FIG. 1.

FIG. 6 is a block diagram illustrating a simplified functional block diagram of the EPROM bias and logic component (14) depicted in FIG. 1. The EPROM bias and logic component (14) includes a bias generator (60), an EPROM driver (62), and a detector (64). Bias generator 60 and detector 64 each have a shutdown terminal (SD) connected to the inverted read enable signal (RDENB). EPROM driver 62 has a shutdown terminal (SD) connected to the read enable signal (RDEN). The inverted read enable signal (RDENB) is the inverse of the read enable signal (RDEN) generated by the read enable logic component (12) described above. The bias generator (60) generates a bias voltage (BIAS N) that is provided to EPROM driver 62 and detector 64. The EPROM driver (62) responds to the loading of any number of EPROM cells and generates the EPROM bias voltage (EPBIAS) necessary for reading the EPROM cells. The EPROM driver (62) and the detector (64) have a sense current control line (SENSE) that allows a sense current (ISEN, not shown) to flow into detector 64. The sense current (ISEN) begins to appear as the EPROM bias voltage is approaching a final bias voltage. Detector 64 establishes a reference current (IREF, not shown). Once the sense current (ISEN) generated by the EPROM driver (62) overcomes the reference current (IREF), the detector (64) generates a bias ready signal (BIASRDY) indicating that the EPROM bias voltage is at a correct bias level for reading the EPROM cells.

The EPROM bias and logic component (14) may further include feedback suppression logic 66. In general, the feedback suppression logic (64) is responsible for suppressing or ignoring feedback from the EPROM cells that may affect biasReady. Feedback suppression logic 66 receives the bias ready signal (BIASRDY) from the detector (64) and outputs the inverted read signal (RDB) used in the EPROM cells for reading. The inverted read signal (RDB) is based on the bias ready signal (BIASRDY). In one embodiment, the feedback suppression logic (66) ensures that the inverted read signal (RDB) will not inadvertently turn off or oscillate due to feedback.

Figure 7:
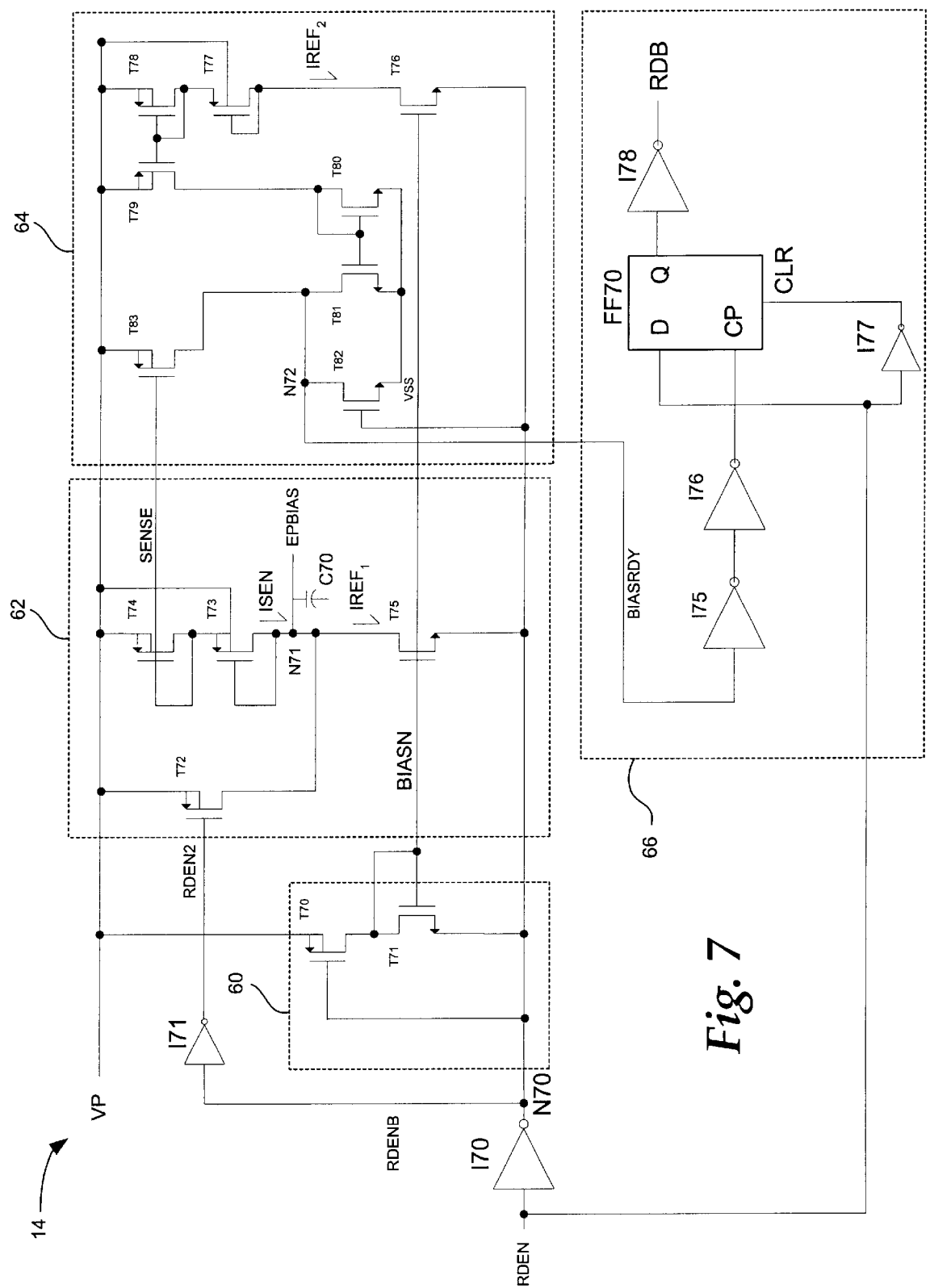
FIG. 7 is a schematic diagram illustrating one embodiment of the EPROM bias and logic component depicted in FIG. 1.

FIG. 7 is a schematic diagram illustrating one embodiment of the EPROM bias and logic component (14) depicted in FIG. 1. Each of the functional blocks (i.e., bias generator 60, EPROM driver 62, detector 64, and feedback suppression logic 66) illustrated in FIG. 6 is illustrated in FIG. 7 within an outlined box. As mentioned above, the EPROM bias and logic component (14) receives the read enable signal (RDEN) from the read enable logic component (12, not shown). The read enable signal (RDEN) is input into inverter 170 resulting in an inverted read enable signal (RDENB) at node N70. When the inverted read enable signal (RDENB) is low (VSS), node N70 provides a ground connection to bias generator 60, EPROM driver 62 and detector 64. A buffered read enable signal (RDEN2) is provided to EPROM driver 62. The output of inverter I70 drives the input of inverter I71, the output of inverter I71 providing the buffered read enable signal (RDEN2). Because the read enable signal (RDEN) and the buffered read enable signal (RDEN2) do not have any appreciative difference in relation to the present invention, hereinafter, both are simply referred to as the read enable signal (RDEN).

The bias generator (60) includes transistors T70 and T71 configured as a current source. The gate of transistor T70 and the source of transistor T71 are connected to node N70. The source of transistor T70 is connected to power supply voltage VP. The drain of transistor T70 is connected to the drain and gate of transistor T71. The gate of transistor T71 serves as a bias voltage for other components. The gate of transistor T71 is also connected to the gate of transistor T75 in the EPROM driver (62) and the gate of transistor T76 in the detector (64).

In addition to transistor T75, the EPROM driver (62) includes two diode connected PMOS transistors T73 and T74 and a switching transistor T72. The gate of transistor T72 is connected to the read enable signal (RDEN) from inverter I71. The source of transistor T72 and the source of transistor T74 are connected to power supply voltage VP. The drain of transistor T72 is connected at node N71 to the drain of transistor T75 and to the drain and gate of transistor T73. Capacitor C70 is shown connected to node N71, denoting the inherent capacitance of the EPROM cells. The source of transistor T73 is connected to the drain and gate of transistor T74. The gate of transistor T74 is also connected to the gate of transistor T83 of the detector (64) as the sense current control line (SENSE) shown in FIG. 6.

In addition to transistors T76 and T83 described above, the detector (64) includes two diode connected PMOS transistors T77 and T78, a first current mirror, a second current mirror and a switching transistor T82. The first current mirror includes transistors T78 and T79 and the second current mirror includes transistors T80 and T81. The drain of transistor T76 is connected to the gate and drain of transistor T77. The source of transistor T77 is connected to the gate and drain of transistor T78. The gate of transistor T78 is also connected to the gate of transistor T79. Drain of transistor T79 is connected to the drain and gate of transistor T80. The gate of transistor T80 is also connected to the gate of transistor T81. The drain of transistor T81 is connected at node N72 to the drain of transistor T82 and the drain of transistor T83. The source of transistors T80–T82 are each connected to VSS. The source of transistors T78, T79, T83 are each connected to power supply voltage VP. At node N72, the detector (64) generates the bias ready signal (BIASRDY). Node N72 also connects with circuitry in the feedback suppression logic (66) as described below.

Feedback suppression logic 66 includes two inverters I75 and I76 in series, a D-type flip-flop FF70, and inverter I77. The input of inverter I75 connects to the detector (64) at node N72. The output of inverter I76 is the clock for flip-flop FF70. The read enable signal (RDEN) is input to the flip-flop FF70 at the D input. Inverter I77 inverts the read enable signal (RDEN) and outputs the inverted read enable signal (RDENB) into the flip-flop FF70 as the CLR. Output of flip-flop FF70 passes through inverter I78 resulting in the inverted read signal (RDB). The inverted read signal (RDB) triggers the reading of the EPROM cells as described in reference to FIG. 3.

As an overview, the EPROM bias and logic component (14) interactively detects when the EPROM bias voltage (EPBIAS) is established and outputs the inverted read signal (RDB) to read the EPROM cells. The operation of the embodiment of the EPROM bias and logic component (14) illustrated in FIG. 7 will be described below with reference to the signals shown in FIG. 2.

Prior to time $T_1$, the read enable signal (RDEN) is low, resulting in the output of inverter I70 being high at node N70. The voltage at node N70 turns transistor T70 off and effectively shuts down bias generator 60 and detector 64. Low read enable signal (RDEN) turns transistor T72 on, which causes the EPROM bias voltage (EPBIAS) at node N71 to be held at the power supply voltage VP. By having the EPROM bias voltage (EPBIAS) held at the power supply voltage, power is conserved.

At time $T_1$, the read enable signal (RDEN) transitions to a high logic level, causing the output of inverter I70 to go low, and establishing a ground level for the circuit. Transistor T72 turns off to allow the EPROM bias voltage (EPBIAS) to begin establishing a final bias level, as shown between times $T_1$ and $T_3$ in FIG. 2. Transistor T70 becomes active and begins supplying a bias current into transistor T71. The bias current through transistor T71 generates a bias voltage (BIAS N). Two identical reference currents (IREF$_1$ and IREF$_2$) flowing through transistors T75 and T76, respectively, are biased by BIAS N. The two reference currents (IREF$_1$ and IREF$_2$) are identical when transistors T75 and T76 have identical dimensions.

First, considering the operation of the EPROM driver 62, at time $T_1$, the EPROM bias voltage (EPBIAS) is substantially identical to the power supply voltage VP and no current flows through transistors T73 and T74. Reference current IREF$_1$ pulls node N71 down and starts discharging capacitor C70. As mentioned earlier, capacitor C70 represents the intrinsic capacitance of the EPROM cells. As the EPROM bias voltage (EPBIAS) drops, the sense current (ISEN) begins flowing through transistors T73 and T74. As mentioned above, transistors T73 and T74 are connected similarly as transistors T30 and T32 in the EPROM cell illustrated in FIG. 3. Transistors T73 and T74 have similar dimensions as transistor pairs T30, T31 and T32, T33, respectively. The dimensions are chosen such that the EPROM bias voltage (EPBIAS) is sufficiently large to provide a good read signal, but not too large that the EPROM bias voltage (EPBIAS) causes a charge in the EPROM cell (i.e., a write to the EPROM cell). Therefore, the sense current (ISEN), in addition to providing a sense function, also represents a total current that would flow through transistors T30–T33 in the EPROM cell illustrated in FIG. 3. The sense current (ISEN) is increased by a factor of four by transistor T83 to provide a gain sense current (IGAIN) into node N72. The detector will use the gain sense current (IGAIN) and its own reference current $IREF_2$ to detect when the EPROM bias voltage (EPBIAS) has reached a final bias level.

Now, considering the operation of the detector (64), at time $T_1$, the reference current $IREF_2$ flows through transistors T77 and T78. As mentioned earlier, transistors T77 and T78 may be identical to transistors T73 and T74. The reference current $IREF_2$ is reflected by transistor T79 into transistor T80 and then reflected up again through transistor T81. The reference current $IREF_2$ appearing at transistor T81 appears quite rapidly because there is little capacitance up to that point. Transistor T82 is responsible for holding the bias ready signal (BIASRDY) low until the read enable signal (RDEN) becomes active. This allows the bias ready signal (BIASRDY) to begin slowly at ground VSS. As the sense current (ISEN) increase, the bias ready signal (BIASRDY) begins to increase. Once the gain sense current (IGAIN) overcomes the reference current ($IREF_2$), the bias ready signal (BIASRDY) transitions to high (see time $T_3$ in FIG. 2).

Finally, considering the operation of the feedback suppression logic (66), once the bias ready signal (BIASRDY) transitions to high at node N72, the bias ready signal (BIASRDY) is delayed by the two inverters I75 and I76 and is then input into flip-flop FF70 as the clock input. The state of the bias ready signal (BIASRDY) is represented at the output of flip-flop FF70 at output Q. The bias ready signal (BIASRDY) is delayed through inverter I78 to buffer the inverted read bias signal (RDB). The state of the bias ready signal (BIASRDY) will not change until the read enable signal (RDEN) becomes inactive (low) and output through inverter 177 to clear the flip-flop FF70.

In one illustrative example, transistor T74 is a PMOS transistor, having a width equal to 2 um and a length equal to 500 nm. Transistor T83 represents four PMOS transistors in parallel, having widths equal to 2 um and lengths equal to 500 nm. The dimensions ensure that node N72 is not indeterminate and that the bias ready signal (BIASRDY) will transition to a high when the EPROM bias voltage (EPBIAS) has established a final bias voltage. Transistor T70 is a PMOS transistor, having a width equal to 500 nm and a length equal to 75 um. Transistor T71 is an NMOS transistor, having a width equal to 500 nm and a length equal to 75 um. Transistors T75 and T76 are NMOS transistors, having a width equal to 1 um and a length equal to 10 um. Each transistor, T73 and T77, represents two PMOS transistors in parallel, having widths equal to 5 um and lengths equal to 600 nm. Transistors T78 and T79 are PMOS transistors, having widths equal to 2 um and length equal to 500 nm. Transistors T80 and T81 are NMOS transistors, having widths equal to 1 um and lengths equal to 10 um. Transistor T82 is a NMOS transistor, having a width equal to 500 nm and a length equal to 1 um.

Figure 8:
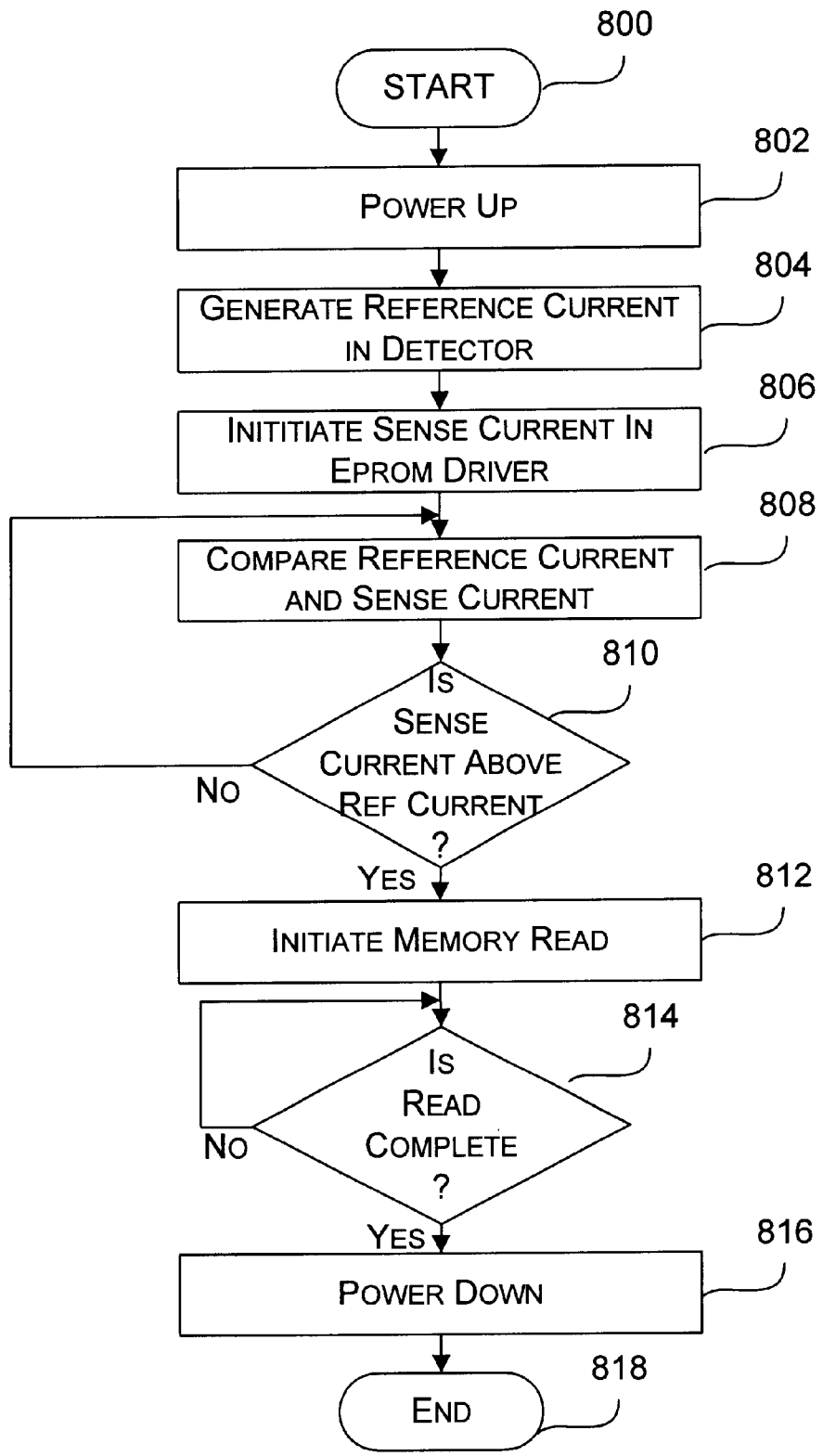
FIG. 8 is a flowchart illustrating one embodiment of the operational flow of the several components for reading a memory element depicted in FIG. 1, in accordance with the present invention.

FIG. 8 is a flowchart illustrating one embodiment of the operational flow of the electronic system for reading a plurality of memory elements (10). The process begins at start block 800 and proceeds to block 802. At block 802, the electronic system is powered up. After the system is powered up, the process proceeds to block 804 where a reference current is generated in the detector. The process proceeds to block 806.

At block 806, a sense current is initiated in the EPROM driver. In one embodiment, the sense current is increased by a factor before proceeding to block 808. At block 808, the sense current is compared to the reference current. The process then proceeds to decision block 810.

At decision block 810, a determination is made whether the sense current is above the reference current. Until the sense current is above the reference current, the process loops back to block 808 and continues comparing the reference current with the sense current. Once the sense current is above the reference current, the process proceeds to block 812.

At block 812, a memory read is initiated in the EPROM memory cell. The process then proceeds to decision block 814. At decision block 814, a determination is made whether the read initiated in block 812 has completed. Until the read has completed, the process loops back to decision block 812 to continue monitoring the read. Once the read has completed, the process proceeds to block 816.

At block 816, the electronic system is powered down and the process proceeds to end block 818.

The above specification, examples and data provide a complete description of the manufacture and use of the composition of the invention. Since many embodiments of the invention can be made without departing from the spirit and scope of the invention, the invention resides in the claims hereinafter appended.

I claim:

1. A circuit for reading at least one memory element, the circuit comprising:
   (a) a read enable circuit that provides a read enable signal;
   (b) a bias circuit that provides a read signal in response to the read enable signal and also in response to a memory element bias voltage, wherein the read signal is in a first state when the memory element bias voltage is at a first voltage level and the read signal is in a second state when the memory element bias voltage is at a second voltage level, wherein data stored in the at least one memory element is read when the read signal is in the second state; and
   (c) an output circuit that detects when the at least one memory element has been read based on the read enable signal and output data that is generated by reading the data stored in the at least one memory element.

2. The circuit of claim 1 wherein the memory element bias voltage is responsive to loading from the at least one memory element.

3. The circuit of claim 1 wherein the output circuit is further configured to signal the read enable circuit to remove the read enable signal.

4. The circuit of claim 1 wherein the output data comprises a first output data and a second output data for each of the at least one memory elements and the output circuit detects when the at least one memory element has been read based on the first and second output data of one of the memory elements and the first output of the remaining memory elements.

5. The circuit of claim 1 wherein the bias circuit comprises:
   (a) a bias generator configured to generate an internal bias voltage;
   (b) a memory element driver that produces the memory element bias voltage in response to the internal bias voltage and is configured to produce a sense current that is responsive to the memory element bias voltage such that the sense current varies with the memory element bias voltage; and (c) a detector that is configured to provide a reference current and the read signal based on a comparison of the reference current and the sense current.

6. The circuit of claim 5 wherein the bias circuit further comprises a feedback suppression logic that is configured to suppress feedback from the at least one memory element affecting the read signal.

7. The circuit of claim 5 wherein the sense current is increased by a predetermined factor before the comparison of the reference current and the sense current.

8. The circuit of claim 5 wherein the reference current is substantially similar to a memory element current that flows through at least one of the at least one memory elements during the reading of the at least one memory element.

9. A method of reading at least one memory element of an electronic device, the method comprising:

(a) enabling a bias circuit that produces a bias signal for a read operation within the electronic device;

(b) generating a reference current corresponding to a memory element current within one of the at least one memory elements during the read operation;

(c) producing a sense current that varies in accordance with loading on the bias circuit;

(d) comparing the reference current with the sense current;

(e) initiating a memory read of the at least one memory element upon detecting that the sense current and the reference current are within a predetermined threshold; and (f) disabling the bias circuit upon detecting that the memory read has completed.

10. The method of claim 9, wherein the sense current is increased by a predetermined factor before comparing the reference current with the sense current.

11. The method of claim 9, wherein producing a sense current comprises:

(a) detecting the loading on the bias circuit due to the at least one memory elements;

(b) producing a bias voltage based on the loading on the bias circuit; and (c) providing the sense current in relation to the bias voltage.

12. The method of claim 11 wherein detecting that the sense current and the reference current are within a predetermined threshold occurs subsequent to when the bias voltage is at a final bias voltage.

13. The method of claim 12 wherein the final bias voltage provides adequate voltage to each of the at least one memory elements for a successful memory read of each of the at least one memory elements.

14. An interactive bias circuit for reading a plurality of memory elements, the interactive bias circuit comprising:

(a) a power-on sensing means that provides a read enable signal when power is available;

(b) a generator means that generates a bias voltage in response to the read enable signal when power is available;

(c) a memory element replica means that produces a sense current and a memory element bias voltage in response to the read enable signal when power is available, the sense current varying in accordance with a loading on the generator means that is associated with the plurality of memory elements, the memory element bias voltage is coupled to the plurality of memory elements;

(d) a detector means that produces a reference current upon detecting the read enable signal when power is available, the reference current being substantially similar to a memory element current resident in one of the plurality of memory elements during a read operation, the detector means also provides a ready signal to the plurality of memory elements when the sense current and the reference current are within a predetermined threshold such that the plurality of non-volatile memory elements initiate the read operation; and (e) an output means that detects when the read operation is complete and signals the power-on sensing means to remove the read enable signal.

15. The interactive bias circuit of claim 14, further comprising a feedback suppression means that suppresses feedback from the plurality of memory elements affecting the ready signal.

16. The interactive bias circuit of claim 14, wherein the generator means includes a current source.

17. The interactive bias circuit of claim 14, wherein the memory element replica means includes a first diode connected transistor and a second diode connected transistor that are connected in series, the first diode connected transistor coupling to a power supply voltage and the second diode connected transistor coupling to a first node such that the first node corresponds to the memory element bias voltage.

18. The interactive bias circuit of claim 14, wherein the memory element replica means further comprises a switching transistor that is configured to receive the read enable signal and coupled to the power supply voltage and the first node in a manner such that the memory element bias voltage is maintained at the power supply voltage until the read enable signal becomes active.

19. The interactive bias circuit of claim 14, wherein the detector means includes two diode connected transistors in series, a first current mirror, and a second current mirror, the reference current being reflected by the first and second mirror to a second node such that the ready signal becomes active upon detecting that the sense current has overcome the reference current at the second node.

20. The interactive bias circuit of claim 19, wherein the detector means further comprises a switching transistor that is coupled to the second mirror at the second node and configured to receive the read enable signal such that the switching transistor holds the ready signal at a first state until the read enable signal is active.

* * * * *